United States Patent [19]

Iwahashi

[11] Patent Number: 5,293,345
[45] Date of Patent: Mar. 8, 1994

[54] SEMICONDUCTOR MEMORY DEVICE HAVING A DATA DETECTION CIRCUIT WITH TWO REFERENCE POTENTIALS

[75] Inventor: Hiroshi Iwahashi, Yokohama, Japan

[73] Assignee: Kabushiki Kaisha Toshiba, Kawasaki, Japan

[21] Appl. No.: 874,220

[22] Filed: Apr. 27, 1992

Related U.S. Application Data

[63] Continuation of Ser. No. 536,739, Jun. 12, 1990, abandoned.

[30] Foreign Application Priority Data

Jun. 12, 1989 [JP] Japan ................... 1-148676

[51] Int. Cl.$^5$ .................. G11C 7/06; G11C 16/04
[52] U.S. Cl. ........................... 365/210; 365/185;
365/189.06; 365/189.09; 365/206; 365/207;
365/208
[58] Field of Search .............. 365/185, 189.06, 189.07,
365/189.09, 206, 207, 208, 210; 307/350, 530,
355, 358, 360

[56] References Cited

U.S. PATENT DOCUMENTS

| 4,301,518 | 11/1981 | Klaas ..................... 365/185 |
| 4,445,203 | 4/1984 | Iwahashi ............ 365/189.07 |
| 4,449,203 | 5/1984 | Adlhoch ................ 365/210 |
| 4,604,732 | 8/1986 | Van Tran .............. 365/207 |
| 4,648,074 | 3/1987 | Pollachek ............. 365/210 |
| 4,654,831 | 3/1987 | Venkatesh ........... 365/207 |
| 4,819,212 | 4/1989 | Nakai et al. ......... 365/207 |
| 4,961,166 | 10/1990 | Sato et al. ........... 365/207 |
| 4,982,364 | 1/1991 | Iwahashi ........... 365/189.09 |

Primary Examiner—Joseph L. Dixon
Assistant Examiner—Jack A. Lane
Attorney, Agent, or Firm—Foley & Lardner

[57] ABSTRACT

A semiconductor memory device comprises a memory cell for storing a binary data, a first reference cell storing a first logic level of a binary data, a second reference cell storing a second logic level of a binary data, a first load circuit connected to the memory cell, a second load circuit connected to the first reference cell, a third load circuit connected to the second reference cell, and a data detection circuit for detecting the stored data of the memory cell by comparing an output from the first load circuit with the outputs from the second and third load circuits.

18 Claims, 5 Drawing Sheets

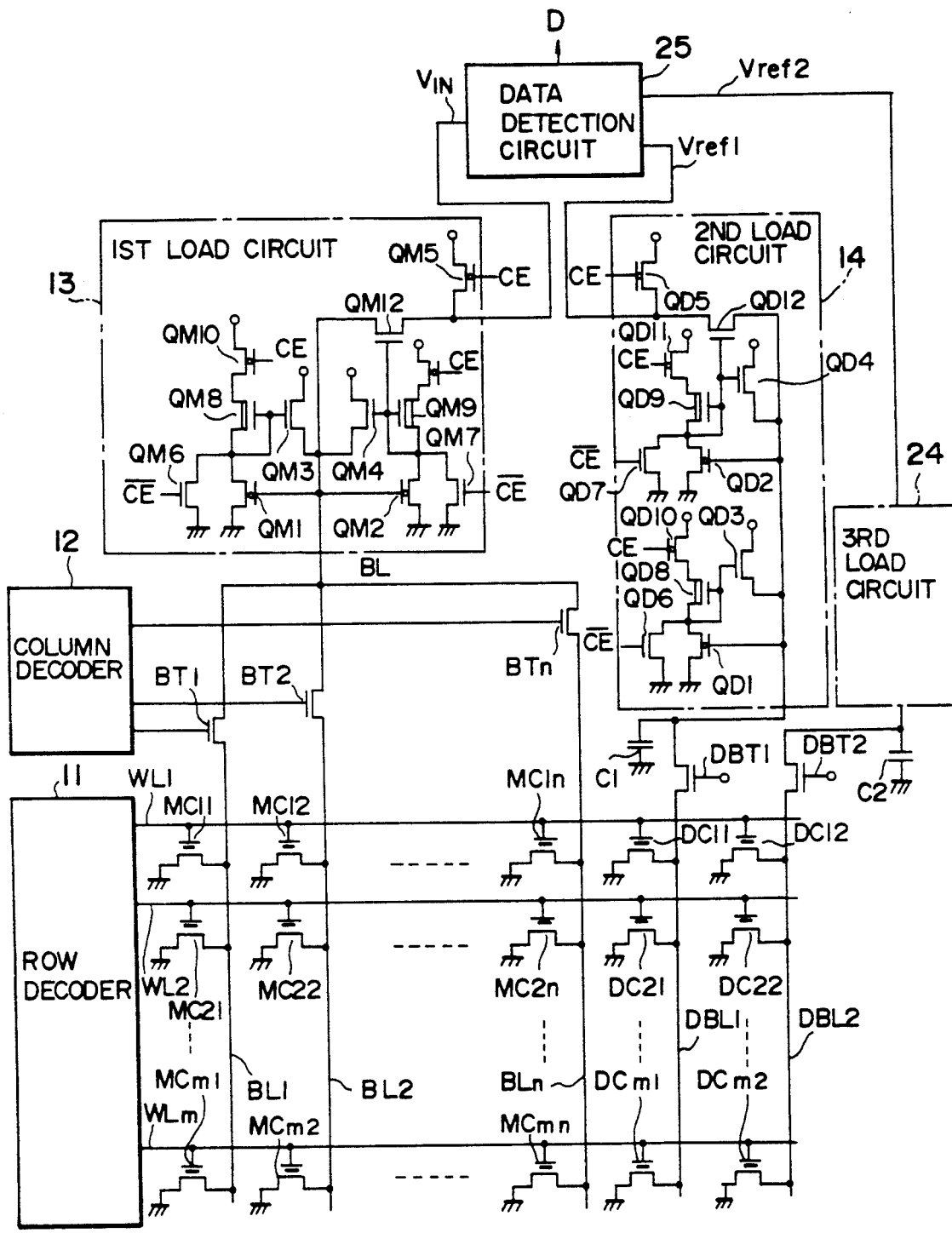
F I G. 1

SEMICONDUCTOR MEMORY DEVICE HAVING A DATA DETECTION CIRCUIT WITH TWO REFERENCE POTENTIALS

This application is a continuation of application Ser. No. 07/536,739, filed Jun. 12, 1990, now abandoned.

BACKGROUND OF THE INVENTION

The present invention relates to a semiconductor memory device.

A conventional semiconductor memory device will be described with reference to FIG. 5. This semiconductor memory is an EPROM having memory cells disposed in a matrix form. Each of the memory cells is a MOSFET having a floating gate and a control gate. Each of memory cells MC11, MC12, ..., MCmn stores a binary data. Each of reference cells DC1, DC2, ..., DCm is a MOSFET having a floating gate, too.

The gates of the memory cells and a reference cell at each row are connected to each row or word line WL1, WL2, ..., WLm, the drains of memory cells at each column are connected to each column or bit line BL1, BL2, ..., BLn, and the drain of reference cells are connected to a reference column or reference bit line DBL. Each memory cell is selected by a column decoder 12 and a row decoder 11. Column gate transistors BT1, BT2, ..., BTn select one of the column lines. The transistor DBT connected to the reference bit line DBL performs a function equivalent to the function of the column gate transistor.

A first load circuit 13 includes MOSFETs QM1 to QM12. The first load circuit 13 amplifies the data from a selected memory cell and outputs it to a data detection circuit 15. A second load circuit 34 includes MOSFETs QD1 to QD12. The second load circuit 34 amplifies the data from a selected reference cell and outputs it to the data detection circuit 15. The data detection circuit 15 compares the data from the selected memory cell with the data from the selected reference cell, and detects the data stored in the selected memory cell and then outputs it to an output buffer. The following is a description of the read operation of the data detection circuit 15 for reading the data stored in a memory cell of the EPROM constructed as above.

Data is programmed in the memory cell by injecting electrons into the floating gate. If the floating gate of a memory cell is injected electrons, it remains off even if a logic "1" level signal is applied to the control gate. If the floating gate of the memory cell is not injected with electrons, the memory cell is turned on when a logic "1" level signal is applied to the control gate of the memory cell. Electrons are not injected in the floating gate of a reference cell so that it is electrically equivalent to the memory cell which has not been injected electrons.

In the first load circuit 13, the data stored in a selected memory cell is amplified and output as a potential $V_{IN}$. Similarly, in the second load circuit 34, the data of a selected reference cell is amplified and output as a reference potential $V_{REF}$. These potentials $V_{IN}$ and $V_{REF}$ are supplied to the data detection circuit 15 which compares them with each other to thereby detect and output the data stored in the memory cell.

As shown in FIG. 6, the data detection circuit 15 is constructed, for example, as a difference sense amplifier having p-channel MOSFETs T21 and T22 and n-channel MOSFETs T23 and T24. The reference potential $V_{REF}$ is applied to the gate of the MOSFET T22, and the potential $V_{IN}$ is applied to the gate of MOSFET T21. As shown in FIG. 7, if a selected memory cell is not injected electrons (indicated at time duration t1), the memory cell is turned on and the potential $V_{IN}$ lowers. On the other hand, if a selected memory cell is injected electrons (indicated at time duration t2), the memory cell is turned off and the potential $V_{IN}$ is charged by the load transistor QM5 and the potential $V_{IN}$ becomes high.

If the first and second load circuits 13 and 34 are constructed of the same circuit, the reference potential $V_{REF}$ is the same potential as that when a selected memory cell is not injected electrons (indicated at time duration t1), as shown by a one-dot chain line. Such a reference potential $V_{REF}$ cannot be used as a reference potential for detecting the data stored in the memory cell. In order to get a potential difference between the reference potential $V_{REF}$ and the potential $V_{IN}$ for the memory cell which is not injected electrons, the reference potential $V_{REF}$ is set substantially at the middle value between the potential $V_{IN}$ for the memory cell which is injected electrons and the potential $V_{IN}$ for the memory cell which is not injected electrons, as shown by a broken line.

If different voltages are applied to the gates of the reference cell and the memory cell, we get the potential difference between the reference potential $V_{REF}$ and the potential $V_{IN}$ with the first and second load circuits 13 and 34 constructed of the same circuit. In this case, since the gates of the memory cell and the reference cell are connected to different signal lines the influence of power source noise on the memory cell is different from the influence of power source noise on the reference cell. Consequently, erroneous operation occurs, when more power source noise is generated. However, the gates of the memory cell and the reference cell are connected to the same row lines WL1 to WLm in order to undergo the same influence of power source noise and to suppress erroneous operation caused by the power source noise. Therefore, the potential difference is obtained by using the different size transistors as the load transistors QM5 and QD5 of the first and second load circuits 13 and 34, respectively. Namely, the channel width of the transistor QD5 is wider than that of the transistor QM5 to raise the reference potential $V_{REF}$ to the broken line level.

With the above arrangement, since there is a difference in the current supply capability between transistors QM5 and QD5, the column line (BL1, BL2, ..., BLn) and the reference column line (DBL) are influenced differently by power source noise. There still remains the problem that erroneous operation due to power source noise cannot be eliminated entirely.

SUMMARY OF THE INVENTION

It is therefore an object of the present invention to provide a semiconductor memory device free from erroneous operation caused by a power voltage fluctuation.

According to an aspect of the present invention, there is provided a semiconductor memory device comprising: a memory cell for storing a binary data; a first reference cell storing a first logic level of a binary data; a second reference cell storing a second logic level of a binary data; a first load circuit connected to said memory cell; a second load circuit connected to said first reference cell; a third load circuit connected to said second reference cell; and a data detection circuit for detecting the stored data of said memory cell by comparing an output from said first load circuit with the outputs from said second and third load circuits.

According to another aspect of the present invention, there is also provided a semiconductor memory device comprising: a memory array having a plurality of memory cells arranged in a matrix form with column lines and row lines, each of said memory cells storing a binary data; a column decoder to select one of said column lines; a row decoder to select one of said row lines; a first reference column line; a second reference column line; a plurality of first reference cells being connected to said first reference column line, each of said first reference cells storing a first logic level of a binary data; a plurality of second reference cells being connected to said second reference column line, each of said second reference cells storing a second logic level of a binary data; a first load circuit connected to said column lines; a second load circuit connected to said first reference column line; a third load circuit connected to said second reference column line; and a data detection circuit for detecting the stored data of said memory cells by comparing the potential of said selected column line with the potentials of said first and second reference column lines.

The load resistances of the first to third load circuits are preferably the same.

According to the present invention, two reference column lines representative of two data states are provided so that there is no need to use load transistors of different sizes.

One of the two data states is equivalent to that of the column line having a selected memory cell in which electrons are not injected, and the first and second load circuit have the same circuit arrangement electrically equivalent (having the same load resistance). Accordingly, the output from the first load circuit connected to the selected memory cell is the same as the output from the second load circuit connected to a first reference cell. Similarly, another one of the two data states is equivalent to that of the column line having a selected memory cell in which electrons are injected, and the first and third load circuits have the same circuit arrangement electrically equivalent (having the same load resistance). Accordingly, the output from the first load circuit connected to the selected memory cell in which electrons are injected is the same as the output from the third load circuit connected to a second reference cell. The data detection circuit compares the output from the first load circuit with the outputs from the second and third load circuits to detect the data stored the selected memory cell. The first load circuit for memory cells and the second and third load circuits for reference cells have the same circuit arrangement. Accordingly, even if a power source voltage fluctuation (power source noise) occurs, the effect thereof is the same for the outputs of the three load circuits. The power source noise can thus be cancelled during the comparison operation at the data detection circuit, thereby avoiding erroneous operation.

BRIEF DESCRIPTION OF THE DRAWINGS

FIG. 1 is a circuit diagram showing the semiconductor memory device according to a first embodiment of this invention;

DESCRIPTION OF THE PREFERRED EMBODIMENTS

Figure 5:
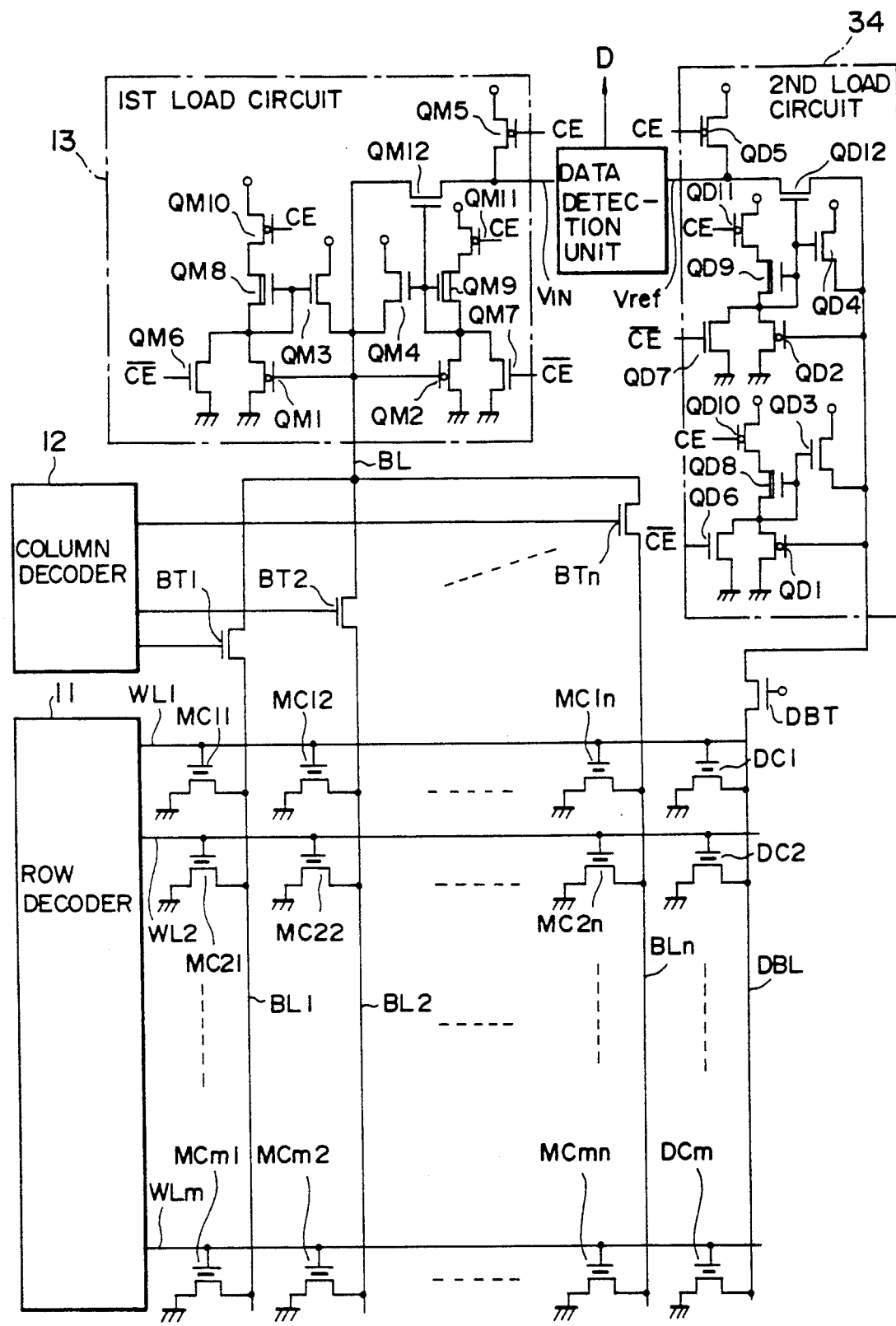
FIG. 5 is a circuit diagram showing a conventional semiconductor memory device.
Figure 6:
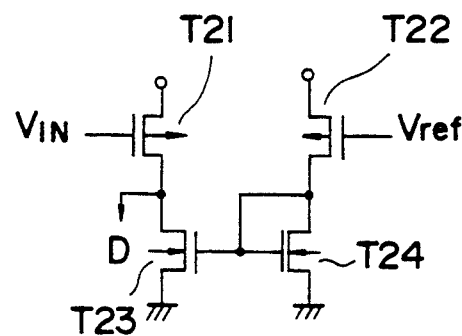
FIG. 6 is a circuit diagram showing the data detection circuit shown in FIG. 5.
Figure 7:
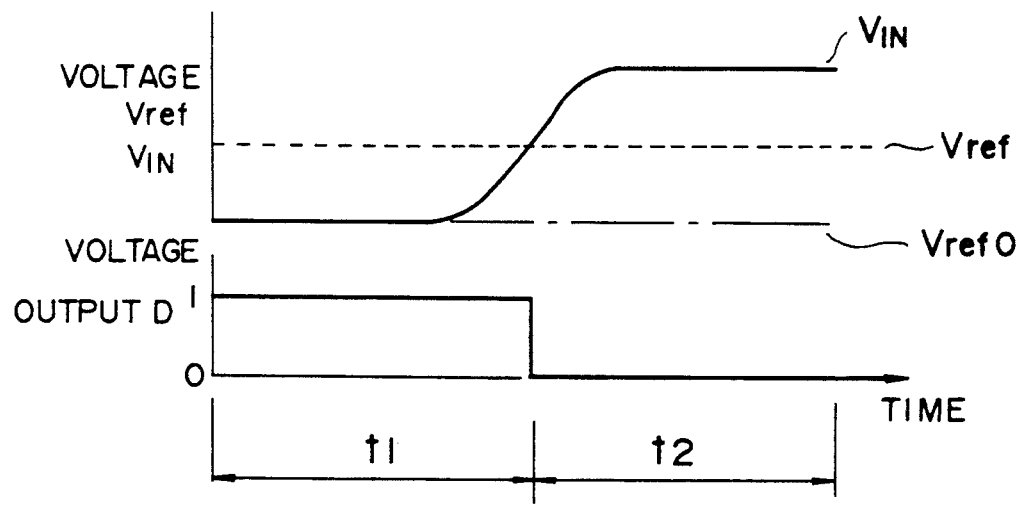
FIG. 7 is a timing chart illustrating the relationship between the output potentials of the load circuits and the output signal of the data detection unit.

FIG. 1 is a circuit diagram showing the circuit arrangement of the semiconductor memory device according to the embodiment of this invention. Unlike a conventional semiconductor memory cell having a single reference column as shown in FIG. 5, the semiconductor memory cell of this invention has two reference columns, one of the reference columns including reference cells DC11, . . . , DCm1 and the other reference column including reference cells DC12, . . . , DCm2. The reference columns are connected to second and third load circuits 14 and 24, respectively. A data detection circuit 25 applies potentials $V_{IN}$, $V_{REF1}$ and $V_{REF2}$ which are output from load circuits 13, 14 and 24 respectively. Like elements to those shown in FIG. 5 are represented by identical reference numerals and symbols, and the description thereof is omitted. Similar to the circuit shown in FIG. 5, n-channel MOSFETs are used. However, it is not limited thereto, but it is obvious that other CMOS circuits including also p-channel MOSFETs may be used depending upon the circuit requirements such as power consumption, operation speed and the like.

The floating gates of reference cells DC11, DC21, DCm1 have no electrons injected, and are equivalent to memory cells which are not injected with electrons. The sources of the reference cells DC12, DC22, . . . , DCm2 are not connected to ground so that no current path is established upon selection thereof, and are equivalent to memory cells in which electrons are injected into the floating gates.

The drains of reference cells DC11, DC21, . . . , DCm1 are connected to a reference column line DBL1, and the drains of reference cells DC12, DC22, DCm2 to a reference column line DBL2.

The second and third load circuits 14 and 24 connected to the reference column lines DBL1 and DBL2 have the same construction as the first load circuit 13 connected to the column line BL. Each of the second and third load circuits 14 and 24 is constructed of MOSFETs QD1 to QD12. The potential at the reference column line DBL1 is the same as that at a column line having a selected memory cell in which electrons are not injected . The potential at the reference column line DBL2 is the same as that at a column line having a selected memory cell in which electrons are injected.

Unlike a conventional circuit, the load resistances of load transistors QD5 of the second and third load circuits 14 and 24 are the same as that of load transistor QM5 of the load circuit 13.

Capacitors C1 and C2 connected to reference column lines DBL1 and DBL2 are used for compensating parasitic capacitances present at the column gates BT1, BT2, ..., BTn of memory cells. The column line BL and the column line DBL1 and DBL2 constructed as above have equivalent electrical characteristics.

Figure 2:
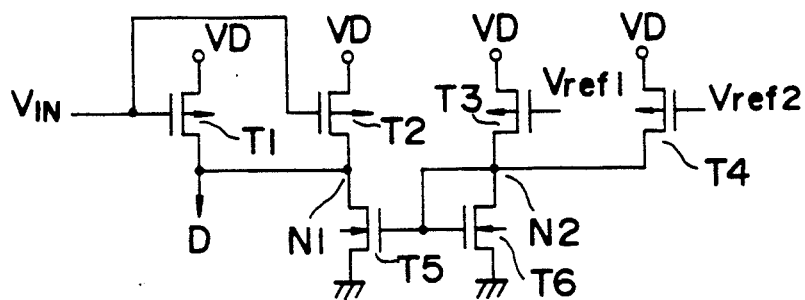
FIG. 2 is a circuit diagram showing the data detection circuit of the device shown in FIG. 1.

The data detection circuit 25 compares the potential $V_{IN}$ which is output from the first load circuit 13 with the reference potentials $V_{REF1}$ and $V_{REF2}$ which are output from the second and third load circuits 14 and 24. The data detection circuit 25 is a difference sense amplifier circuit as shown in FIG. 2. P-channel transistors T1 and T2 have their sources connected to a power supply VD, drains connected in common, and gates applied with the potential $V_{IN}$. P-channel transistors T3 and T4 have their gates applied with potentials $V_{REF1}$ and $V_{REF2}$, respectively, sources connected to the power supply VD, and drains connected in common to the gate and drain of an n-channel transistor T6. The source of transistor T6 is grounded and its gate is connected to the gate of another n-channel transistor T5. The drain of transistor T5 is connected to the drains of transistors T1 and T2. The source of transistor T5 is grounded. The comparison result by this circuit is output as a signal D from the node N1 of the drains of transistors T1 and T2.

The operation of the embodiment constructed as above will be described.

Memory cells connected to one of the row lines WL are selected by the row decoder 11, and one of the column gate transistors BT is turned on by the column decoder 12 to select one of the column lines. A data stored a memory cell at the intersection between the selected row and column is read. If the selected memory cell has no electrons injected in the floating gate, this memory cell is turned on so that the selected column line BL changes to a discharging state. On the other hand, if the selected memory cell has electrons injected in the floating gate, this memory cell is non-conductive so that the selected column line BL becomes in a charging state.

The potential of the column line is applied to the data detection circuit 25 as the output potential $V_{IN}$ from the first load circuit.

A read operation for the reference cell is executed in a similar manner. Two reference cells connected to the selected row line WL are selected. Upon selection of one of the reference cells DC11, DC21, ..., DCm1 in which no electrons are injected, this selected reference cell becomes conductive so that, similar to the memory cell which is not injected electrons, the reference column line DBL1 becomes in a discharging state and the output voltage $V_{REF1}$ is applied from the second load circuit 14 to the data detection circuit 25. On the other hand, upon selection of one of the reference cells DC12, DC22, ..., DCm2, any current path is not formed in the selected reference cell so that the reference column line DBL2 becomes in a charging state and the output voltage $V_{REF2}$ is applied from the third load circuit 24 to the data detection circuit 25.

Figure 3:
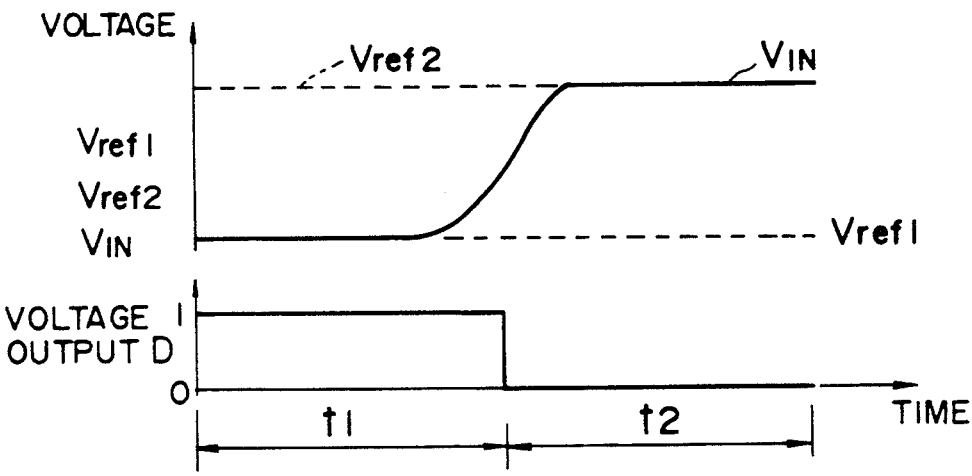
FIG. 3 timing chart illustrating the relationship between the output potentials of the load circuits and the output signal of the data detection circuit shown in FIG. 1.

Next, the description will be given for the operation of the data detection circuit 25 which compares the output potential $V_{IN}$ with the potential $V_{REF1}$ and $V_{REF2}$ and outputs a signal D. FIG. 3 is a timing chart illustrating the relationship between the potentials $V_{IN}$, $V_{REF1}$ and $V_{REF2}$. As described previously, the potential $V_{REF2}$ is higher than the potential $V_{REF1}$, and the potential $V_{IN}$ is substantially the same as the potential $V_{REF1}$ when a selected memory cell is not injected electrons in the floating gate (indicated at time duration t1), whereas the potential $V_{IN}$ it is substantially the same as the potential $V_{REF2}$ if a selected memory cell is injected electrons in the floating gate (indicated at time duration t2).

In the data detection circuit 25, the potential $V_{REF1}$ output from the second load circuit 14 is applied to the gate of transistor T3, and the potential $V_{REF2}$ from the third load circuit 15 is applied to the gate of transistor T4. The gates of transistors T1 and T2 are applied to the potential $V_{IN}$ from the first load circuit 13.

The p-channel transistor T3 with the discharging state potential $V_{REF1}$ being applied becomes conductive, whereas the p-channel transistor T4 with the charging state potential $V_{REF2}$ being applied becomes non-conductive. Transistors T1 and T2 become conductive if the potential $V_{IN}$ becomes in a discharging state as in the case of $V_{REF1}$ (indicated at time duration t1), whereas they become non-conductive if the potential $V_{IN}$ becomes in a charging state as in the case of $V_{REF2}$ (indicated at time duration t2).

While the potential $V_{IN}$ is in a discharging state (time duration t1), transistors T1 and T2 become conductive. The sum of the conductivity resistances of the conducted transistors T1 and T2 becomes smaller than the sum of the conductivity resistances of transistors T3 and T4. As a result, the data detection circuit 25 outputs a signal D of a logic "1" as shown in FIG. 3.

While the potential $V_{IN}$ is in a charging state (time duration t2), both transistors T1 and T2 do not become conductive. The sum of the conductivity resistances of transistors T1 and T2 becomes larger than the sum of the conductivity resistances of transistors T3 and T4. As a result, the signal D of a logic "0" is outputted.

As described above, this embodiment provides two types of reference cells corresponding to two types of storage states of memory cells. The data stored in a memory cell and two reference cells are read by the three load circuits each having the same circuit arrangement. An output potential of the load circuit changes with the storage state of a selected memory cell, and it is compared with the two output potentials from the two reference cells of different type, to thereby detect the data stored in the selected memory cell.

As seen from the foregoing description, memory cells and reference cells are connected to the same row line, and the second and third load circuits 14 and 24 for reference cells as well as the first load circuit for memory cells have the same circuit arrangement. Accordingly, different from a conventional device, the current supply capability of the load transistor QD5 for reference cells can be set the same as that for memory cells. As a result, the influence of a power supply voltage fluctuation (power source noise) is the same for both memory cells and reference cells, thereby cancelling out the fluctuation and avoiding an erroneous operation.

For example, in the case where a memory cell which has not been injected electrons is selected, the influence of a power source noise is the same for the output potential $V_{IN}$ from the first load circuit 13, and for the output potential $V_{REF1}$ from the second load circuit 14 connected to the reference cell which is not injected electrons. Although the output potential $V_{REF2}$ from the third load circuit 24 also changes with the power source noise, the sum of the conductivity resistances of transistors T1 and T2 is maintained smaller than the sum of the conductivity resistances of transistors T3 and T4. Accordingly, even if there is a power source noise, the data detection circuit 25 outputs a signal D of "1".

Similarly, in the case where a memory cell which is injected electrons in the floating gate is selected, the influence of a power source noise is the same for the output potential $V_{IN}$ from the first load circuit 13, and for the output potential $V_{REF2}$ from the third load circuit 24. Although the output potential $V_{REF1}$ from the second load circuit 14 also changes with the power source noise, the sum of the conductivity resistances of transistors T1 and T2 is maintained larger than the sum of the conductivity resistances of transistors T3 and T4. Accordingly, the data detection circuit 25 outputs a signal D of "0".

According to this embodiment, erroneous operation can be avoided even if a power supply voltage fluctuation occurs.

In the embodiment shown in FIG. 2, the sizes of transistors T1, T2, T3, and T4 are made identical so that the sum of the conductivity resistances of transistors T1 and T2 while the potential $V_{IN}$ is either in a charging state or in a discharging state, is made either larger or smaller than the sum of the conductivity resistances of transistors T3 and T4. The sizes of transistors T1, T2, T3 and T4 are not limited to be identical only if the above relationship is satisfied.

Figure 4:
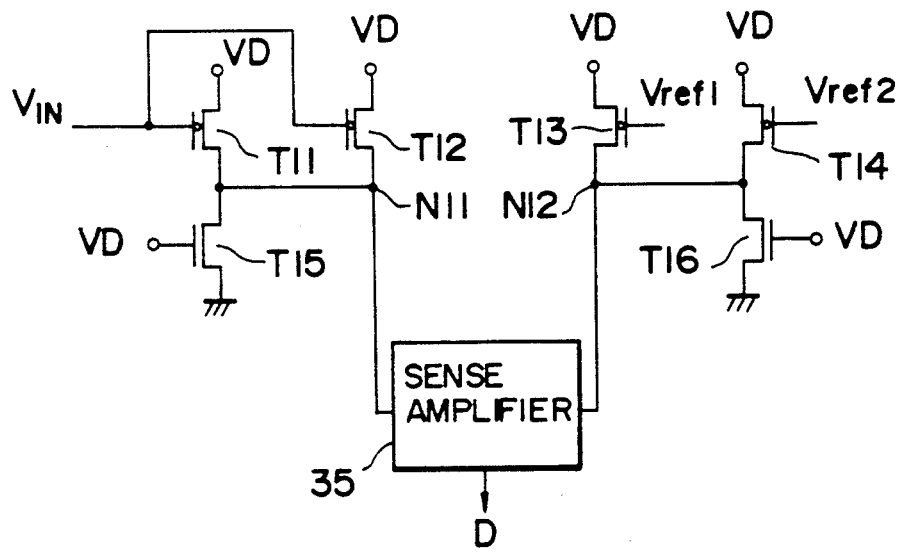
FIG. 4 is a circuit diagram showing the data detection circuit according to further embodiment.

The above embodiment is not intended to limit the scope of this invention. For example, the load circuit may be realized with a different circuit arrangement only if it can output a signal in correspondence with the storage state of a memory cell or a reference cell. The data detecting circuit for detecting the storage state of a memory cell may be realized with a different circuit arrangement which is shown in FIG. 4 by way of example. Transistors T11, T12, T13 and T14 are n-channel MOSFETs of the same type having a threshold voltage of about 0 V and the same current supply capability. Similar to the data detection circuit shown in FIG. 2, the potential $V_{IN}$ is applied to the gates of transistors T11 and T12, the reference potential $V_{REF1}$ to the gate of transistor T13, and the reference potential $V_{REF2}$ to the gate of transistor T14. The drains of transistors T11 to T14 are connected to a power source VD, and the sources of transistors T11 and T12 are connected in common to the drain of an n-channel enhancement transistor T15 at node N11. The gate of transistor T15 is connected to the power source VD and the source is grounded. The sources of transistors T13 and T14 are connected in common to the drain of an n-channel enhancement transistor T16 at node N12. The gate of transistor T16 is connected to the power source VD and the source is grounded. Transistors T15 and T16 have the same size. The sum of the conductivity resistances of transistors T11 and T12 becomes larger or smaller than the sum of the conduction resistances of transistors T13 and T14, in accordance with the storage state of a selected memory cell. This difference of potentials at nodes N11 and N12 is detected and amplified by a differential sense amplifier 35 and the result is output as a signal D. The above-described circuit may be used as the data detection circuit 25.

Figure 1A:
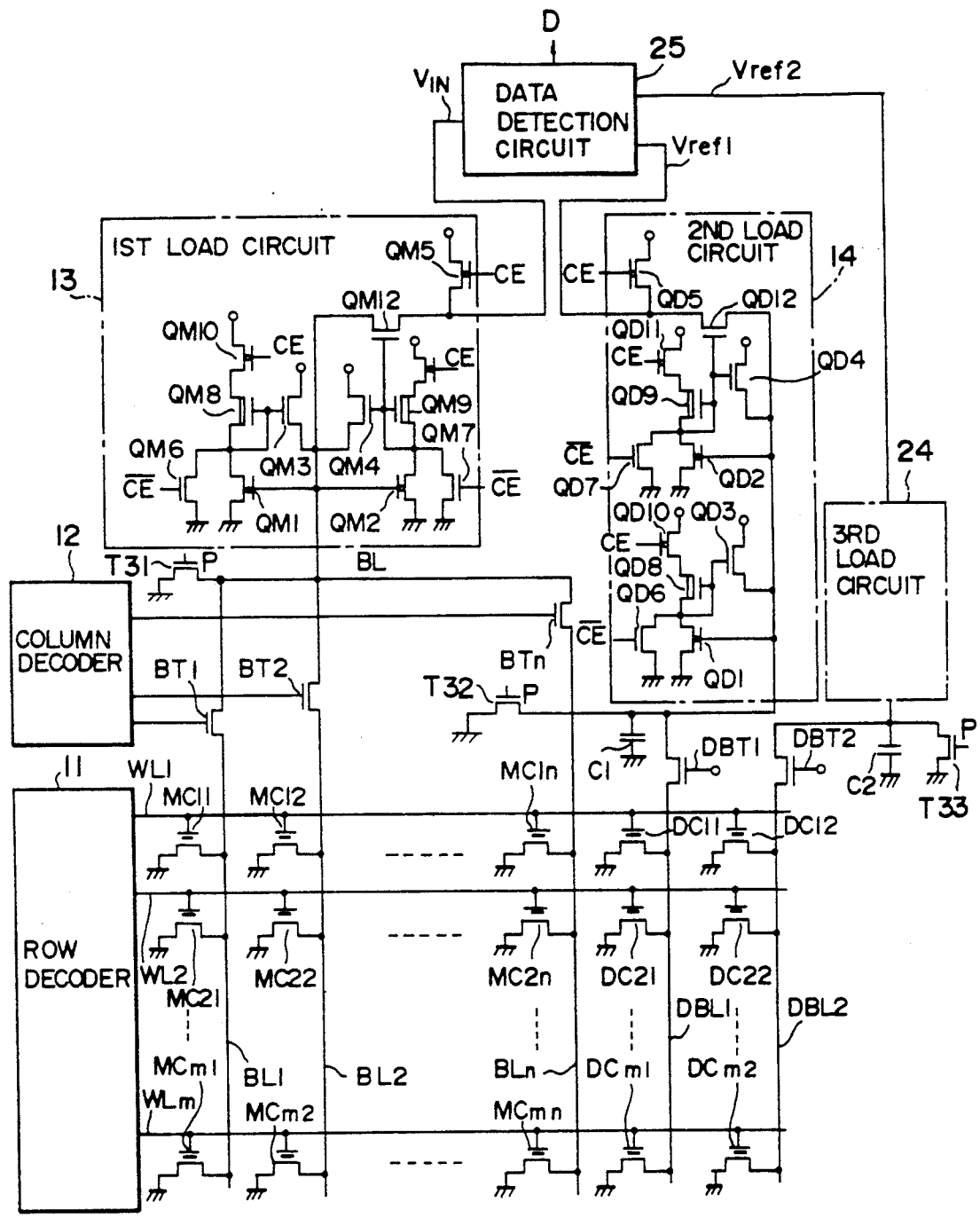
FIG. 1A is a circuit diagram showing the semiconductor memory device according to another embodiment.

Although the reference column line DBL2 has no discharging path and is floated electrically in order for this floating state to not be used, a transistor T33 flowing a small current may be connected between the reference column line DBL2 and ground as shown in FIG. 1A. In this case, transistors T31 and T32 flowing a small current are also connected to the column lines BL and reference column line DBL1.

In order to flow the small current through the transistors T31, T32 and T33, a potential P which is slightly higher than the threshold voltages of the transistor T31, T32 and T33 is applied to the gates of the transistors T31, T32 and T33, respectively.

What is claimed is:

1. A semiconductor memory device comprising:
   a memory cell for storing binary data, said cell being connected to a signal line to which a first load circuit is connected;
   a first reference cell storing a first logic level of binary data, said first reference cell being connected to a first reference line, a second load circuit having an identical current supply ability as that of said first load circuit and a first capacitor, for compensating parasitic capacitance of the signal line, both said second load circuit and said first capacitor being connected to said first reference line, wherein, since the second load circuit and the first load circuit have the same circuit configuration and the same current supply abilities, a fluctuation in a power supply voltage has the same effect for both said memory cell and the first reference cell, thereby preventing an erroneous operation of the semiconductor memory device;
   a second reference cell storing a second logic level of binary data, said second reference cell being connected to a second reference line, a third load circuit having an identical current supply ability as that of said first load circuit and a second capacitor, for compensating parasitic capacitance of the signal line, both said third load circuit and said second capacitor being connected to said second reference line, wherein, since the third load circuit and the first load circuit have the same circuit configuration and the same current supply abilities, the fluctuation in the power supply voltage has the same effect for both said memory cell and the second reference cell, thereby preventing an erroneous operation of the semiconductor memory device; and
   a data detection circuit for detecting the stored data of said memory cell, said data detection circuit having a first input, a second input, a third input and an output, said first input being connected to said signal line, said second input being connected to said first reference line, said third input being connected to said second reference line, said data detection circuit comparing a potential of said signal line with potentials of said first and second reference lines, a logic level of the output being determined by comparing the potential of said signal line with the potentials of said first and second reference lines.

2. A semiconductor memory device according to claim 1, wherein each of said first, second and third load circuits has a load resistance of the same value.

3. A semiconductor memory device according to claim 2, wherein each of said first, second and third load circuits has the same circuit configuration.

4. A semiconductor memory device according to claim 2, wherein said memory cell, said first reference cell and said second reference cell belonging to a corresponding row are connected to a common row line.

5. A semiconductor memory device according to claim 2, wherein said data detection circuit generates one of two logic levels of binary data from the output when the potential of said signal line is equal to the potential of said first reference line, said data detection circuit generates another of said two logic levels of binary data from the output when the potential of said signal line is equal to the potential of said second reference line.

6. A semiconductor memory device according to claim 5, wherein said data detection circuit is comprised of a differential sense amplifier.

7. A semiconductor memory device according to claim 6, wherein said differential sense amplifier includes a first input transistor connected to the first input, a second input transistor connected to the second input and a third input transistor connected to the third input, the potential of said signal line being applied to said first input transistor, the potential of said first reference line being applied to said second input transistor, the potential of said second reference line being applied to said third input transistor, said differential sense amplifier detecting said binary data stored in said memory cell by determining the difference between current flowing through said first input transistor and the sum of currents flowing through said second and third input transistors caused by the potentials of said signal line, said first reference line and said second reference line.

8. A semiconductor memory device according to claim 7 wherein said differential sense amplifier further comprises:
first and second N channel transistors, gates thereof being commonly connected, and sources thereof being grounded,
said first input transistor being a P channel transistor, the potential of the signal line being applied to the gate thereof, a power supply voltage being applied to the source thereof and the drain thereof being connected to the drain of said first N channel transistor,
said second and third input transistors being P channel transistors, the potentials of said first and second reference lines being respectively applied to the gate thereof, the power supply voltage being applied to the sources thereof and the drains thereof being commonly connected to the drain and gate of said second N channel transistor, and
detected data being taken out from the connection node between the drain of said first N channel transistor and the drains of said first input transistor.

9. A semiconductor memory device according to claim 7, wherein said differential sense amplifier further comprises:
said first input transistor being an N channel transistor, the potential of said signal line being applied to the gate thereof, the power supply voltage being applied to the drain thereof, the source thereof being connected to a first pull down transistor, and
said second and third input transistors being N channel transistors, the potentials of said first and second reference lines being respectively applied to the gates thereof, the power supply voltage being applied to the drains thereof, sources thereof being commonly connected to a second pull down transistor.

10. A semiconductor memory device according to claim 2, wherein leak means are provided for said second reference line, said leak means prevents said second reference line from electrically floating.

11. A semiconductor memory device comprising:
a memory cell for storing binary data, said memory cell having a floating gate, said memory cell being connected to a signal line to which a first load circuit is connected, a logic state of the binary data stored in said memory cell being determined by whether or not electrons have been injected into said floating gate;
a first reference cell storing a first logic level of binary data, said first reference cell being connected to a first reference line, a second load circuit having an identical current supply ability as that of said first load circuit and a first capacitor, for compensating parasitic capacitance of the signal line, both said second load circuit and said first capacitor being connected to said first reference line, said first logic level corresponding to said stored data of said memory cell when electrons are not injected in said floating gate, wherein, since the second load circuit and the first load circuit have the same circuit configuration and the same current supply abilities, a fluctuation in a power supply voltage has the same effect for both said memory cell and the first reference cell, thereby preventing an erroneous operation of the semiconductor memory device;
a second reference cell storing a second logic level of binary data, said second reference cell being connected to a second reference line, a third load circuit having an identical current supply ability to said first load circuit and a second capacitor, for compensating parasitic capacitance present on the signal line, both said third load circuit and said second capacitor being connected to said second reference cell, said second logic level corresponding to said stored data of said memory cell when electrons are injected in said floating gate, wherein, since the third load circuit and the first load circuit have the same circuit configuration and the same current supply abilities, the fluctuation in the power supply voltage has the same effect for both said memory cell and the second reference cell, thereby preventing an erroneous operation of the semiconductor memory device; and
a data detection circuit for detecting the stored data of said memory cell, said data detection circuit having a first input, a second input, a third input and an output, said first input being connected to said signal line, said second input being connected to said first reference line, said third input being connected to said second reference line, said data detection circuit comparing a potential of said signal line with potentials of said first and second reference lines, a logic level of the output being determined by comparing the potential of said signal line with the potentials of said first and second reference lines.

12. A semiconductor memory device according to claim 11, wherein each of said first, second and third load circuits has a load resistance of the same value.

13. A semiconductor memory device according to claim 12, wherein each of said first, second and third load circuits has the same circuit configuration.

14. A semiconductor memory device comprising:
a memory array having a plurality of memory cells arranged in a matrix form with column lines and row lines, each of said memory cells storing binary data;

a column decoder to select one of said column lines to which a first load circuit is connected;

a row decoder to select one of said row lines;

a first reference column line connecting a plurality of first reference cells, each of said first reference cells storing a first logic level of binary data, said first reference column line to which a second load circuit having an identical current supply ability as that of said first load circuit, and a first capacitor for compensating parasitic capacitance of the column line are connected, wherein, since the second load circuit and the first load circuit have the same circuit configuration and the same current supply abilities, a fluctuation in a power supply voltage has the same effect for both said memory cell and the first reference cell, thereby preventing an erroneous operation of the semiconductor memory device;

a second reference column line connecting a plurality of second reference cells, each of said second reference cells storing a second logic level of binary data, said second reference column line to which a third load circuit having an identical current supply ability as that of said first load circuit, and a second capacitor for compensating parasitic capacitance of the column line are connected, wherein, since the third load circuit and the first load circuit have the same circuit configuration and the same current supply abilities, the fluctuation in the power supply voltage has the same effect for both said memory cell and the second reference cell, thereby preventing an erroneous operation of the semiconductor memory device; and a data detection circuit for detecting the stored data of said memory cells, said data detection circuit having a first input, a second input, a third input and an output, said first input being connected to selected one of said column lines, said second input being connected to said reference column line, said third input being connected to said second reference column line, said data detection circuit comparing a potential of said selected column line with potentials of said first and second reference column lines, a logic level of the output being determined by comparing the potential of said selected column line with the potentials of said first and second reference column lines.

15. A semiconductor memory device according to claim 14, wherein said first and second reference column lines including first and second capacitance means respectively, and wherein a capacitance existing in said first reference column line to which said first capacitance means is connected is equal to a capacitance existing in one of said column lines, and a capacitance existing in said second reference column line to which said second capacitance means is connected is equal to a capacitance existing in one of said column lines.

16. A semiconductor memory device according to claim 14, wherein each of said first, second and third load circuits including first, second and third load transistors respectively, each of said first, second and third load transistors is the same size, each of said first, second and third load circuits has the same circuit configuration.

17. A semiconductor memory device according to claim 16, wherein said data detection circuit includes a first input transistor connected to the first input, a second input transistor connected to the second input and a third input transistor connected to the third input, the potential of said selected column line being applied to said first input transistor, the potential of said second reference column line being applied to said third input transistor, said data detection circuit detecting said binary data stored in said memory cell by the difference between a current flowing through said first input transistor and the sum of currents flowing through said second and third input transistors caused by the potentials of said selected column line, said first reference column line and said second reference column line.

18. A semiconductor memory device according to claim 17, wherein each of said memory cells having a floating gate, a logic state of the binary data stored said memory cell being determined by whether or not electrons are injected to said floating gate.

* * * * *